US010283657B1

(12) United States Patent
Welser et al.

(10) Patent No.: US 10,283,657 B1
(45) Date of Patent: May 7, 2019

(54) BROADBAND PHOTOVOLTAIC SHEETS AND METHOD OF CONSTRUCTING THE SAME

(71) Applicant: Magnolia Optical Technologies, Inc., Woburn, MA (US)

(72) Inventors: Roger E. Welser, Providence, RI (US); Ashok K. Sood, Brookline, MA (US)

(73) Assignee: Magnolia Optical Technologies, Inc., Woburn, MA (US)

( * ) Notice: Subject to any disclaimer, the term of this patent is extended or adjusted under 35 U.S.C. 154(b) by 0 days.

(21) Appl. No.: 14/213,675

(22) Filed: Mar. 14, 2014

Related U.S. Application Data

(63) Continuation-in-part of application No. 12/985,921, filed on Jan. 6, 2011, now abandoned.
(Continued)

(51) Int. Cl.
*H01L 31/00* (2006.01)
*H01L 31/0352* (2006.01)
(Continued)

(52) U.S. Cl.
CPC ...... *H01L 31/035236* (2013.01); *H01L 31/18* (2013.01); *H01L 29/122* (2013.01);
(Continued)

(58) Field of Classification Search
CPC ............. H01L 31/03046; H01L 29/122; H01L 31/02168; H01L 33/44; H01L 33/46; H01L 31/02327
(Continued)

(56) References Cited

U.S. PATENT DOCUMENTS

| 5,707,459 A * | 1/1998 | Itoyama ............... H01L 31/048 136/251 |
| 2004/0171187 A1* | 9/2004 | Kataoka .................. B32B 37/10 438/64 |

(Continued)

OTHER PUBLICATIONS

Okada et al., Fabrication of Potentially Modulated Multi-quantum well solar cells, Photovoltaic Specialists Conference, 2005. Conference Record of the Thirty-first IEEE, Jan. 3-7, 2005, pp. 591-594.*

(Continued)

*Primary Examiner* — Angelo Trivisonno
(74) *Attorney, Agent, or Firm* — Loginov & Associates, PLLC; William A. Loginov

(57) ABSTRACT

The invention described herein details flexible, high-efficiency photovoltaic cells with nano-enhanced absorbers and ultra-low dark current. By extending infrared absorption, power conversion efficiencies in single-junction, nano-enhanced solar cells can potentially meet or even exceed the Shockley-Queisser limit. Novel device designs utilizing advanced band gap engineering are employed to suppress non-radiative recombination and expose the limiting radiative component of the dark current. Light trapping structures and new nanostructured absorber designs are also considered to maximize the creation and collection of photogenerated carriers. Flexible photovoltaic devices are fabricated using established full-wafer epitaxial liftoff processes. The innovative design described herein provides for light-weight and flexible photovoltaic sheets capable of achieving ultra-high conversion efficiencies over a wide range of operating conditions.

17 Claims, 7 Drawing Sheets

Related U.S. Application Data

(60) Provisional application No. 61/789,797, filed on Mar. 15, 2013, provisional application No. 61/293,469, filed on Jan. 8, 2010.

(51) Int. Cl.
| | |
|---|---|
| *H01L 31/18* | (2006.01) |
| *H01L 31/0216* | (2014.01) |
| *H01L 29/12* | (2006.01) |
| *H01L 31/0304* | (2006.01) |
| *H01L 31/0232* | (2014.01) |
| *H01L 33/46* | (2010.01) |
| *H01L 33/44* | (2010.01) |

(52) U.S. Cl.
CPC .. *H01L 31/02168* (2013.01); *H01L 31/02327* (2013.01); *H01L 31/03046* (2013.01); *H01L 33/44* (2013.01); *H01L 33/46* (2013.01)

(58) Field of Classification Search
USPC ........................................... 136/252
See application file for complete search history.

(56) References Cited

U.S. PATENT DOCUMENTS

| | | | |
|---|---|---|---|
| 2006/0151023 A1* | 7/2006 | Dubbeldam | 136/256 |
| 2008/0092943 A1* | 4/2008 | Cornfeld | H01L 27/142 136/252 |
| 2009/0025776 A1* | 1/2009 | Varaprasad | C03C 17/001 136/243 |
| 2011/0168261 A1 | 7/2011 | Welser et al. | |
| 2011/0203663 A1* | 8/2011 | Prather | H01L 31/02168 136/259 |
| 2012/0031478 A1* | 2/2012 | Boisvert | H01L 31/072 136/255 |

OTHER PUBLICATIONS

Atre et al., Toward high-efficiency solar upconversion with plasmonic nanostructures, J. Opt. 14 (2012) 024008.*

Chhajed et al., Nanostructured multilayer graded-index antireflection coating for Si solar cells with broadband and omnidirectional characteristics, Appl. Phys. Lett. 93, 251108 (2008).*

Wei et al., Intermediate-Band Solar Cells Employing Quantum Dots Embedded in an Energy Fence Barrier, Nano Letters, vol. 7, No. 1, pp. 218-222 (2007).*

Okada et al., Fabrication of Potentially Modulated Multi-quantum well solar cells, Photovoltaic Specialists Conference, 2005. Conference Record of the Thirty-first IEEE, Jan. 3-7, 2005, pp. 591-594. (Year: 2005).*

Atre et al., Toward high-efficiency solar upconversion with plasmonic nanostructures, J. Opt. 14 (2012) 024008. (Year: 2012).*

Chhajed et al., Nanostructured multilayer graded-index antireflection coating for Si solar cells with broadband and omnidirectional characteristics, Appl. Phys. Lett. 93, 251108 (2008). (Year: 2008).*

Wei et al., Intermediate-Band Solar Cells Employing Quantum Dots Embedded in an Energy Fence Barrier, Nano Letters, vol. 7, No. 1, pp. 218-222 (2007). (Year: 2007).*

Dapkus et al., High Efficiency Epitaxial Optical Reflector Solar Cells, NREL/TP-451-5591 (1993). (Year: 1993).*

Welser, et al., "U.S. Appl. No. 61/683,676, Broadband, Omnidirection Antireflection Structures and Method of Constructing the Same", , Published in: US.

Alemu, et al., "Dependence of Device Performance on Carrier Escape Sequence in Multi-Quantum-Well p-i-n Solar Cells", "Journal of Applied Physics", May 4, 2006, pp. 084506-1-084506-5, vol. 99, No. 084506, Publisher: American Institute of Physics, Published in: US.

Okada, et al., "Fabrication of Potentially Modulated Multi-Quantum Well Solar Cells", "Conference Record of the Thirty-First IEEE Photovoltaic Specialist Conference", Jan. 3, 2005, pp. 591-594, Publisher: IEEE, Published in: US.

* cited by examiner

BROADBAND PHOTOVOLTAIC SHEETS AND METHOD OF CONSTRUCTING THE SAME

RELATED APPLICATIONS

This application claims the benefit of U.S. Provisional Application Ser. No. 61/789,797, filed Mar. 15, 2013, entitled BROADBAND PHOTOVOLTAIC SHEETS AND METHOD OF CONSTRUCTING THE SAME, the entire disclosure of which is herein incorporated by reference. This application is also a continuation-in-part of, and claims the benefit of, co-pending U.S. patent application Ser. No. 12/985,921, filed Jan. 6, 2011, entitled CONCENTRATOR PHOTOVOLTAIC SUBASSEMBLY AND METHOD OF CONSTRUCTING THE SAME, the entire disclosure of which is herein incorporated by reference, which claims the benefit of U.S. Provisional Patent Application Ser. No. 61/293,469, filed on Jan. 8, 2010, entitled EFFICIENT SOLAR CELL EMPLOYING MULTIPLE ENERGY-GAP LAYERS AND LIGHT-SCATTERING STRUCTURES AND METHODS FOR CONSTRUCTING THE SAME, which is also expressly incorporated herein by reference.

FIELD OF THE INVENTION

This invention relates to semiconductor-based photovoltaic energy converters, also known as "solar cells;" and to flexible photovoltaic sheets; and to concentrator photovoltaic systems and subassemblies; and to the design and fabrication of the same.

BACKGROUND OF THE INVENTION

Photovoltaic (PV) devices can provide a portable source of electrical power for a wide variety of commercial and defense applications. Many of these mobile and portable power applications can directly benefit from the development of flexible, lightweight, and high-efficiency photovoltaic sheets. Emerging technical approaches for achieving flexible photovoltaic power include the growth of copper indium gallium diselenide (CIGS) cells on flexible substrates and the epitaxial liftoff (ELO) of III-V devices onto thin metal film handles. With both approaches, however, advanced designs are needed; designs that can further increase power generating performance, lower module weight, enhance robustness, and reduce costs.

III-V photovoltaic devices employing nano-inspired technologies can dramatically outperform CIGS cells, enabling the design of flexible PV sheets that combine ultra-low weight with ultra-high power density. Nano-enhanced solar cells seek to harness a wide spectrum of photons at high voltages in a single junction device by embedding narrow energy-gap wells within a wide energy-gap matrix. By avoiding the limitations of current matching inherent in multi junction devices, nano-enhanced broadband solar cells have the potential to deliver ultra-high efficiency over a wide range of operating conditions. Since their initial suggestion by researchers at Imperial College, quantum well solar cells have been demonstrated in a variety of different material systems, and the basic concept has been extended to include quantum dots. Clear improvements in infrared spectral response have been experimentally confirmed in both quantum well and quantum dot solar cells. However, photon absorption, and thus current generation, is hindered in conventional nano-enhanced solar cells by the limited path length of incident light passing vertically through the device. Moreover, the insertion of narrow energy-gap material into the device structure often results in lower voltage operation, and hence in lower PV power conversion efficiency. Both of these issues are addressed with the novel device structure disclosed herein.

SUMMARY OF THE INVENTION

The illustrative embodiments described herein details flexible, high-efficiency photovoltaic cells with nano-enhanced absorbers and ultra-low dark current. By extending infrared absorption, power conversion efficiencies in single-junction, nano-enhanced solar cells can potentially meet or even exceed the Shockley-Queisser limit. Novel device designs utilizing advanced band gap engineering are employed to suppress non-radiative recombination and expose the limiting radiative component of the dark current. Light trapping structures and new nanostructured absorber designs are also considered to maximize the creation and collection of photogenerated carriers. Flexible photovoltaic devices are fabricated using established full-wafer epitaxial liftoff processes. The innovative design described herein provides for light-weight and flexible photovoltaic sheets capable of achieving conversion efficiencies in excess of 30% over a wide range of operating conditions.

The illustrative embodiments described herein advantageously:

Minimizing dark current with an extended wide band gap emitter structure,

Recycling unabsorbed and emitted photons with a back reflective contact, and

Incorporating a limited number of layers of narrow band gap material.

Unwanted space charge recombination is minimized in this invention by including an extended region of wide energy gap material within the depletion region adjacent to the emitter. Ultra-low dark currents and record-high open circuit voltages have been demonstrated in InGaAs quantum well devices that employ this type of advanced band gap engineering. To maximize current output while minimizing radiative recombination, the nano-inspired photovoltaic structure described herein includes a limited number of thick, narrow band gap wells, possibly with embedded quantum dots, and advanced light trapping structures. This design is based upon observations on the nature of radiative recombination and the nature of absorption in quantum-structured solar cells, observations inferred from reported dark diode and spectral response measurements. Moreover, optical scattering into optical cavities within thin-film devices provides a physical mechanism to dramatically increase photocurrent generation in nanostructured absorbers. The structure described herein therefore includes a back omnidirectional reflector (ODR) structure capable of achieving high internal reflectivity over a broad spectrum of wavelengths and a wide range of angles. Such conductive, high-performance ODR structures on the back surface of thin-film solar cells can potentially increase both the current and voltage output by scattering unabsorbed and emitted photons back into the active region of the device. Furthermore, antireflection coatings can be applied both above and below the encapsulant to minimize broadband reflection losses, scatter light into the underlying nano-enhanced absorber, and leverage optical cavity effects.

BRIEF DESCRIPTION OF THE DRAWINGS

The invention description below refers to the accompanying drawings, of which.

DETAILED DESCRIPTION

Embodiments of the invention are discussed below with reference to FIGS. 1-7. Those skilled in the art will readily appreciate that the detailed description given herein with respect to these figures is for explanatory purposes, however, because the invention extends beyond these limited embodiments.

Figure 1:
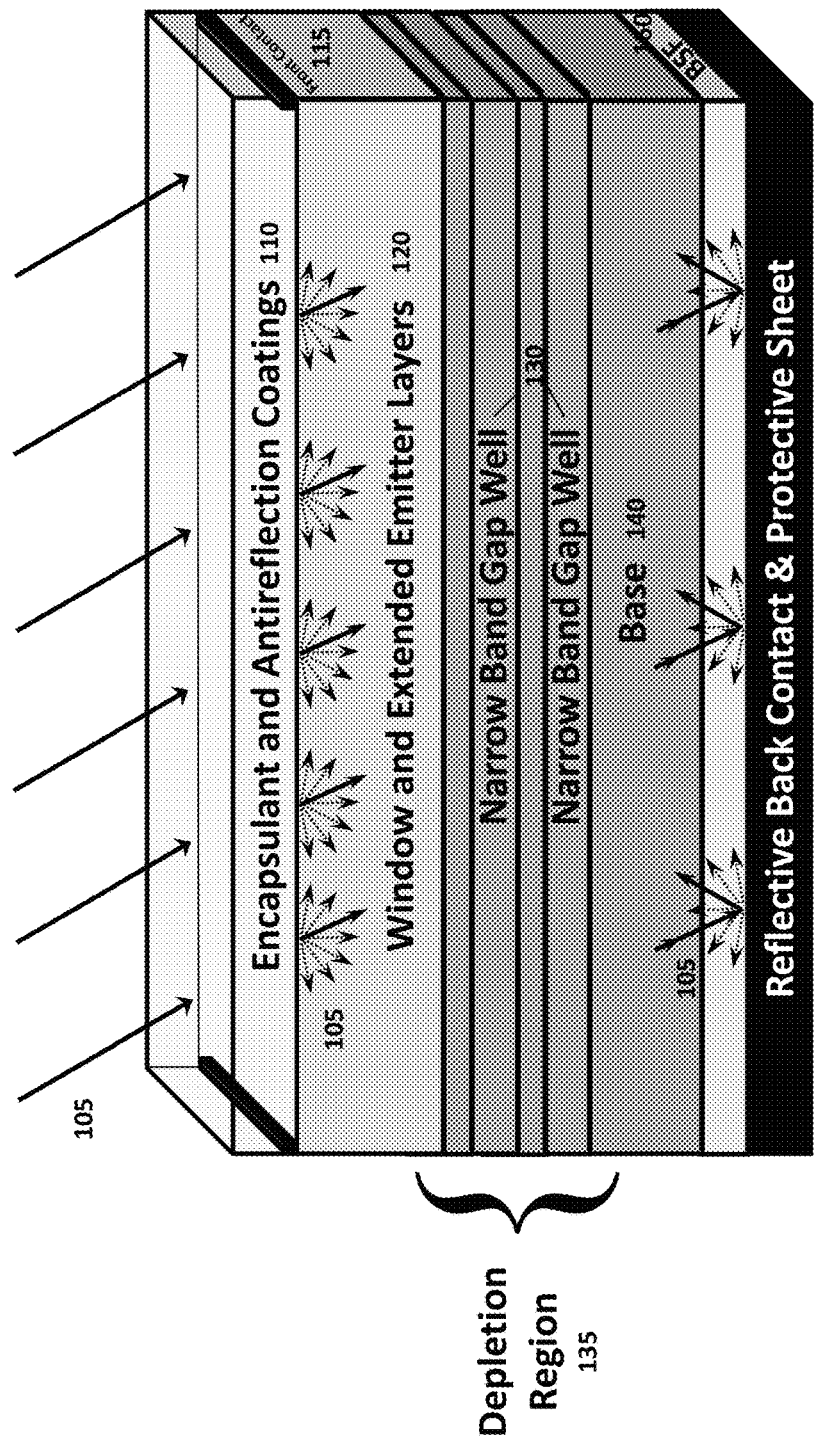
FIG. 1 is a schematic cross-sectional side view of a flexible, high-efficiency photovoltaic sheet having at least one narrow band gap layer embedded within a base layer and a wider energy gap extended emitter including material in both the emitter and the depletion region, according to an illustrative embodiment.

FIG. 1 details a cross-sectional view of an illustrative embodiment of a flexible, broadband photovoltaic sheet that incorporates various nano-inspired features. Incident photons 105 strike the top surface of an anti-reflective encapsulant structure 110 and are then transmitted into an underlying semiconductor window and extended emitter layer structure 120. The semiconductor base layer 140 is comprised of material with an energy gap that is less than or equal to the semiconductor material used in the window and extended emitter layers. The unabsorbed incident light 105 and photons emitted from the base layer structure 140 then pass through the higher energy gap back surface field (BSF) and semiconductor contact layers 160, and are reflected back into the base layer absorber by a reflective back contact and underlying protective sheet 180. Front contacts 115 can be formed by employing a conventional grid pattern as depicted in FIG. 1, or can comprise back point contacts formed by via etching (not shown).

To increase the current generating capacity of the base layer structure 140, a limited number of narrow band gap wells 130 are embedded within the base layer. To ensure efficient collection of photogenerated carriers from the narrow band gap wells, the narrow band gap material is placed within the depletion region 135 of the semiconductor junction formed by the juxtaposition of emitter and base layers of opposite doping polarity. To minimize the dark current, wider band gap material is also include in the depletion region adjacent to the emitter, forming an extended wide band gap emitter structure. The doping level profile across the semiconductor junction must be carefully controlled to ensure that the heterojunctions remain within the depletion region, even under forward bias.

In a simple embodiment, the reflective back contact 180 consists of a metal film in electrical contact with heavily-doped, wider band gap material that is transparent relative to the base layer material. Higher internal back reflectively can be achieved by inserting a low-index material between the semiconductor and the metal. Alternatively, hybrid back reflectors are conceived in which the semiconductor, low-index dielectric, and metallic materials are mixed in a three dimensional pattern that provides both high internal reflectivity and low electrical resistance. The back reflector design is constructed and arranged to enhance optical cavity effects that increase absorption within the base layer 140 and narrow band gap layers 130.

The encapsulant and antireflection coating structure 110 consists of several subparts. Flexible, polymer-based or UV-resistance polycarbonate-based materials are adhered to the front surface to encapsulate and protect the cell. To reduce reflection loss, a multi-layer coating is applied to the cell before encapsulation. This antireflection structure is adjusted to minimize external reflection of incident photons while maximizing the internal reflection of emitted photons. In the highest performance photovoltaic sheets, the topmost surface of the encapsulating sheet is also coated with an antireflection structure designed to minimize reflection losses at the air-encapsulant interface. For useful background material, refer to co-pending commonly assigned U.S. patent application Ser. No. 12/946,580 entitled HIGH TRANSMITTANCE OPTICAL WINDOWS AND METHOD OF CONSTRUCTING THE SAME, by Welser et al, and U.S. Provisional Patent Application Ser. No. 61/683,676, entitled BROADBAND, OMNIDIRECTIONAL ANTIREFLECTION STRUCTURES AND METHOD OF CONSTRUCTING THE SAME, by Welser et al., the teachings of which are incorporated by reference as useful background material.

In a simple embodiment, the narrow band gap region 130 consists of a single layer of a narrower band gap material of fixed composition. However, more complex designs are also contemplated, including compositionally graded wells, multiple layer structures, and structures that embed quantum dots within the wells. In addition, more advanced designs further extend infrared performance by effectively enabling photon up-conversion. Photon up-conversion structures can be included as part of the narrow band gap well design 130 within the base layer; or added to the structure below the base layer 140 and above the reflective back contact 180.

Figure 2:
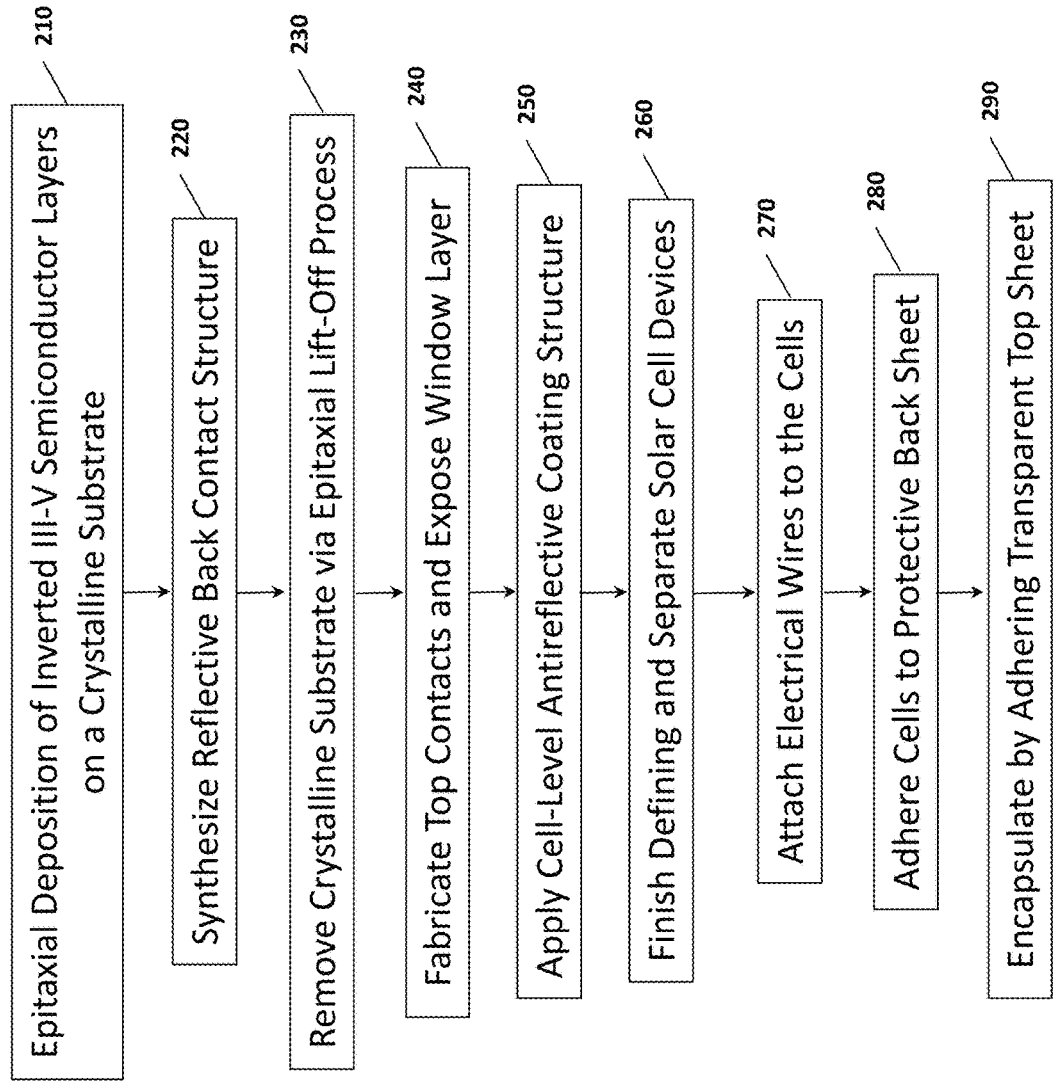
FIG. 2 is a flow diagram of a procedure for constructing flexible, nano-inspired broadband photovoltaic sheets, according to an illustrative embodiment.

FIG. 2 depicts a flow diagram of a fabrication process for constructing flexible, photovoltaic sheets, according to an illustrative embodiment employing III-V semiconductor materials. First, at step 210, the semiconductor layers are epitaxially deposited on a starting crystalline substrate using standard processes such as metalorganic chemical vapor deposition (MOCVD) or molecular beam epitaxy (MBE). The epitaxial layers are grown inverted, meaning that the window and emitter layers are grown first and the back surface field and semiconductor back contacts are deposited last. After the epitaxial deposition of the semiconductor layers at step 210, the reflective back contact is synthesized on the exposed epitaxial layers at step 220. Next, the epitaxial material is mounted on a temporary holder and the substrate removed at step 230, desirably via an epitaxial lift-off (ELO) process. The front contacts are then fabricated and the window layer exposed at step 240, and a cell-level antireflection coating (ARC) structure applied at step 250. After applying the ARC, the cells are defined and separated at step 260, electrical contact wires attached at step 270, typically by welding, and the cells adhered to a protective back sheet at step 280. The flexible photovoltaic sheet is completed once encapsulated at step 290 by laminating on a front transparent sheet, typically employing transparent optical adhesives such as ethylene vinyl acetate (EVA), or other adhesives and appropriate materials commonly available and known to those skilled in the art.

Figure 3:
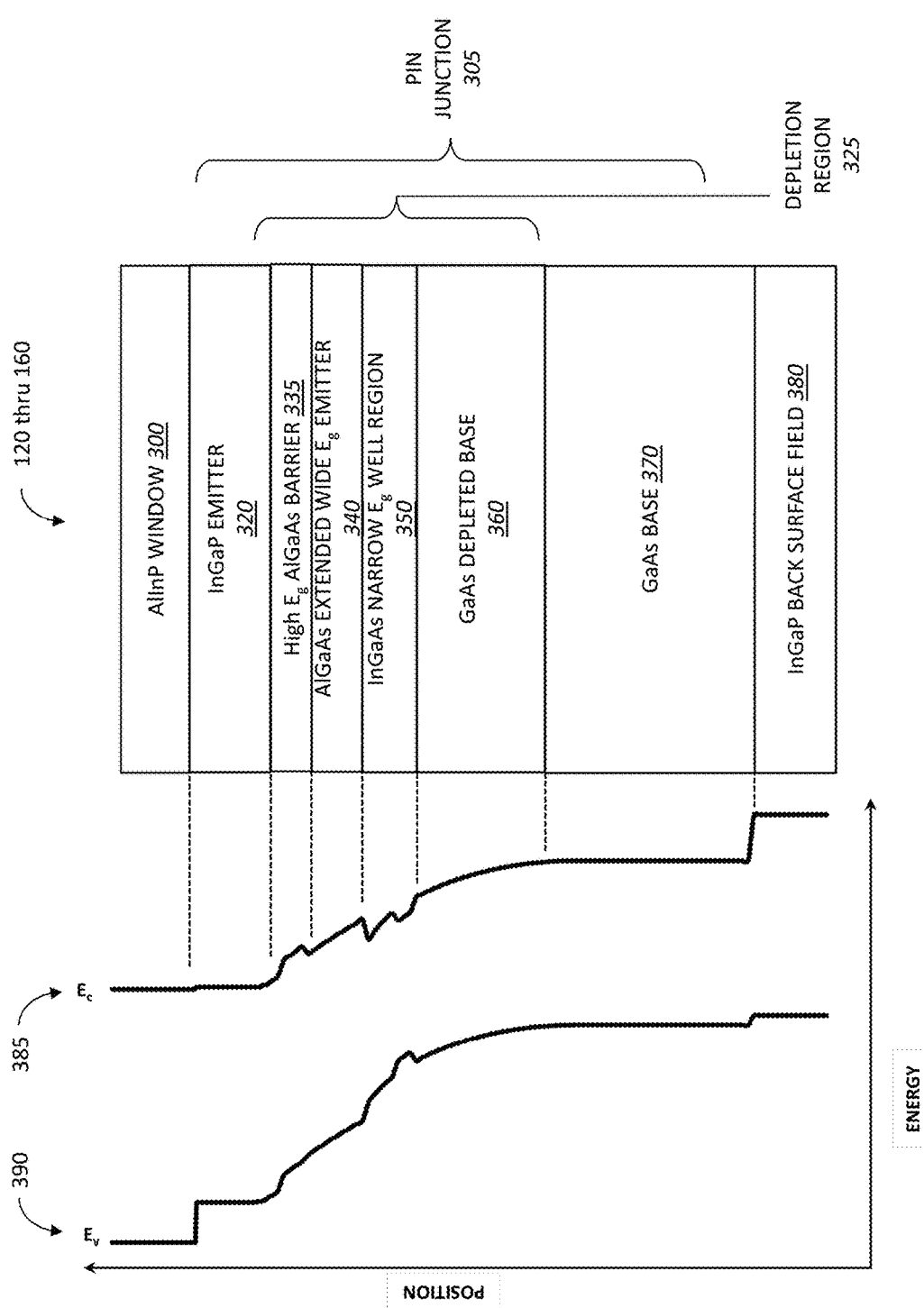
FIG. 3 is a diagram of the energy band versus position for a material structure of a thin film semiconductor solar cell, illustrating the desirable design elements to achieve a high operating voltage in a structure having both narrow and wide energy gap material, in accordance with illustrative embodiments.

The layer structures and associated energy bands graph depicted in FIG. 3, which is simplified to facilitate understanding, show the elements of a III-V semiconductor thin film solar cell device structure (120 through 160) according to an illustrative embodiment. The structure in FIG. 3 encompasses the window and extended emitter layers 120 shown in FIG. 1, along with the base layer 140, narrow band gap well 130, and back surface field 160. For descriptive purposes, the thin film solar cell device structure comprises an AlInP window 300, a GaAs-based PIN junction 305, and an InGaP back surface field 380 according to an illustrative embodiment. As shown, the PIN junction 305 consists of a n-type InGaP emitter 320; a p-type GaAs base 370 (the base layer includes GaAs with at least one embedded InGaAs well); an InGaP back surface field (the back surface field and contact layers contain InGaP and AlGaAs materials); and a depletion region 325 illustratively shown to include with a wide energy gap ($E_g$) AlGaAs barrier layer 335, an extended wide energy gap ($E_g$) AlGaAs emitter layer 340, a narrow energy gap ($E_g$) InGaAs well region layer 350, and a depleted GaAs base layer region 360. The depletion region is distinguished by the presence of a built-in electric field, a non-zero slope in the conduction band 385 ($E_c$) and the valence band 390 ($E_v$), induced by the juxtaposition of n-type and p-type semiconductor material. In the illustrative embodiment, the depletion region is on the order of approximately 0.1 to 2 microns for thin film solar cells. It should be apparent to those skilled in the art that the thickness of the depletion region can be adjusted by varying the thickness of unintentionally doped or lightly doped material between the p-type and n-type material, and that a similar structure comprises an n-type InGaP emitter and p-type AlGaAs base, according to conventional techniques.

The illustrative device structure shown in FIG. 3 provides several mechanisms by which to suppress the diode dark current. Without being bound to a particular theory, the larger energy gap of the InGaP emitter 320 relative to the GaAs base 370 reduces the diffusion of holes out of the p-type base layer. In addition, electron diffusion is suppressed in this structure by placing a higher energy-gap AlGaAs barrier 335 adjacent to the n-type InGaP emitter 320. The conduction band offset ($\Delta E_v$) at the type II InGaP emitter/AlGaAs barrier (335/320) interface also alters the distribution of electrons within the depletion region. By reducing the electron concentration injected from the n-type InGaP emitter 320, the region of enhanced recombination within the depletion region can be pulled closer to the n-side of the structure, away from the InGaAs well region 350 and into the wide band gap material 340 in the depletion region adjacent to the emitter, thus reducing space charge recombination. The extended AlGaAs emitter and barrier (340/335) structure illustrated in FIG. 3 thus reduces both the non-radiative n=1 diffusion and n=2 space charge recombination components of the diode dark current.

While non-radiative recombination can be minimized by the use of the extended emitter heterojunction structure depicted in FIG. 3, radiative recombination within the InGaAs wells can still fundamentally limit the dark current, and hence the operating voltage, of the device. Previously, Yoshitaka Okada and co-workers at the University of Tsukuba have suggested the use of step graded InGaAs wells as a means of minimizing recombination losses in quantum well solar cells (see Y. Okada and N. Shiotsuka, "Fabrication of Potentially Modulated Multi-Quantum Well Solar Cells," Proceedings of the 31st IEEE Photovoltaic Specialists Conference, December 2005). Okada argues that radiative recombination rates inside the wells can be reduced due to spatial separation of electron and hole wavefunctions, which can result from placing the quantum wells within the built-in field of the depletion region of a P-N or P-I-N junction device.

Figure 4:
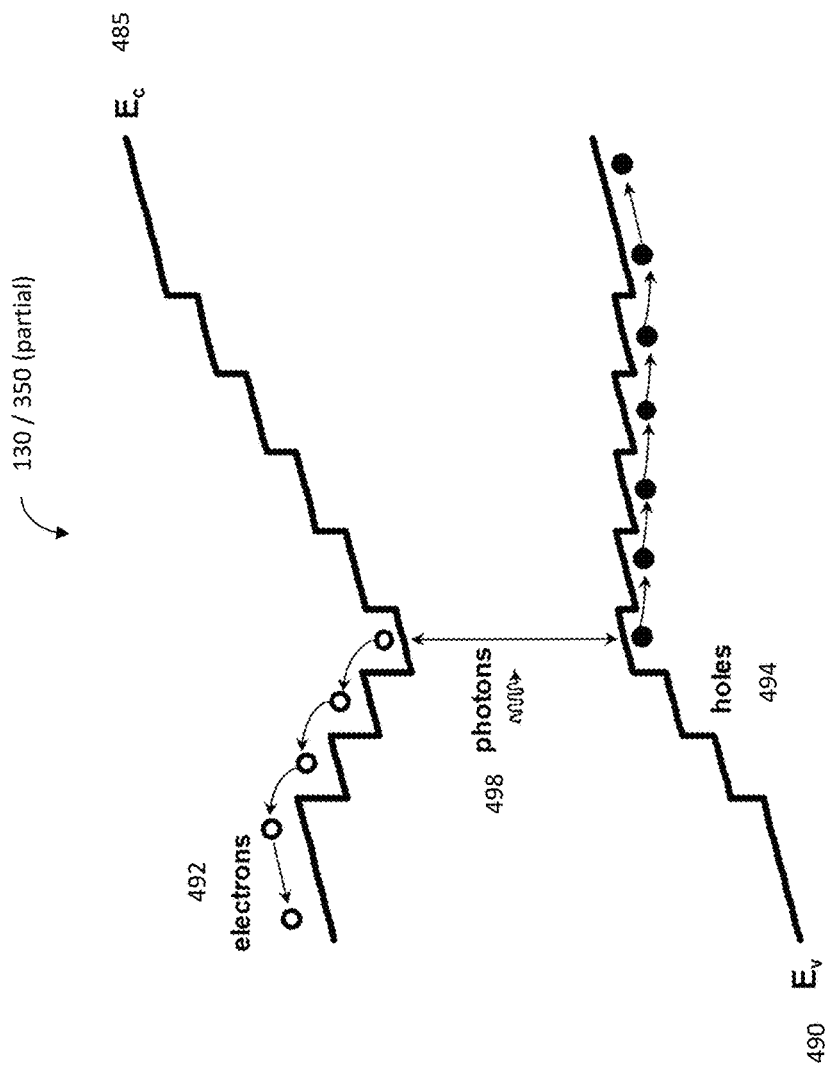
FIG. 4 is a diagram of the energy band versus position for part of the material structure of a thin film semiconductor solar cell, showing various carrier escape mechanisms from an asymmetric narrow band gap well, in accordance with illustrative embodiments.

With reference to FIG. 4, higher escape rates, and further reductions in the wavefunction overlap, can be engineered by employing a step graded compositional profile to allow photogenerated carriers to readily "hop" (i.e. move) out of the InGaAs well. In FIG. 4, an incident photon 498 creates an electron 492—hole 494 pair that escapes from the InGaAs well region 350 through a series of field-assisted thermionic emission steps (for useful background material refer to A. Alemu, J. A. H. Coaquira, and A. Freundlich, "Dependence of Device Performance on Carrier Escape Sequence in Multi-Quantum-Well p-i-n Solar Cells," J. Appl. Phys., vol. 99, no. 084506, May 2006). Similar escape mechanisms allow carriers being swept towards either the emitter or the base to avoid being capture in the InGaAs well region and potentially recombining radiatively and lowering the dark current.

It should now be apparent to those skilled in the art that the compositional profile of the wells within the narrow band gap region can be adjusted to enhance carrier escape, minimize carrier overlap, and/or increase the concentration of excited electrons available for optical up-conversion processes. The narrow band gap well depicted in FIG. 4 exhibits an exemplary asymmetric, step-graded compositional profile.

Figure 5:
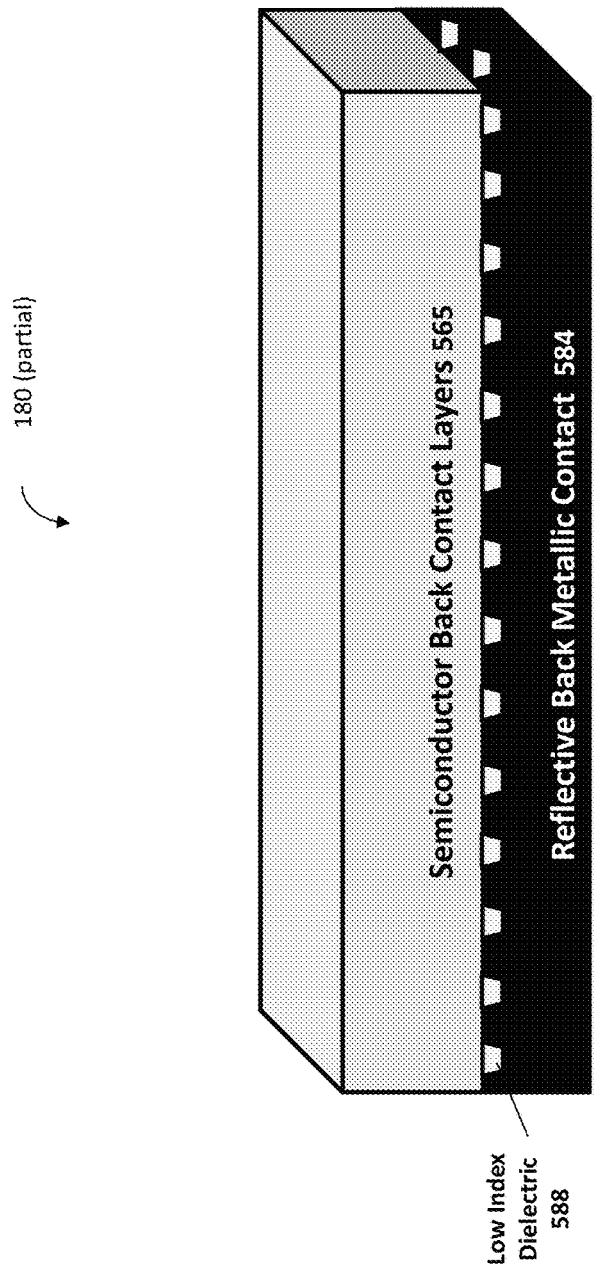
FIG. 5 is a cross-sectional schematic of a reflective hybrid back contact arrangement, in accordance with illustrative embodiments.

As previously noted herein, hybrid back reflector structures are described in which the semiconductor, low-index dielectric, and metallic materials are mixed in a three dimensional pattern that provides both high internal reflectivity and low electrical resistance. FIG. 5 depicts an illustrative hybrid back reflector structure in which the back semiconductor contact layers 565 are in contact with a reflective metallic film 584 that is perforated with a low index dielectric material 588. Silicon dioxide and indium tin oxide are illustrative examples of suitable low index dielectric material 588. The low index dielectric material 588 can also include any optically transparent material with a refractive index below that of the semiconductor contacts (n~3). The hybrid structure can be synthesized by selectively depositing the low index material 588 on the semiconductor material, then over-coating with a metallic film 584. Alternatively, the low index material 588 can be selective removed after uniformly coating the semiconductor contact layer 565, followed by the deposition of a metallic film 584.

Figure 6:
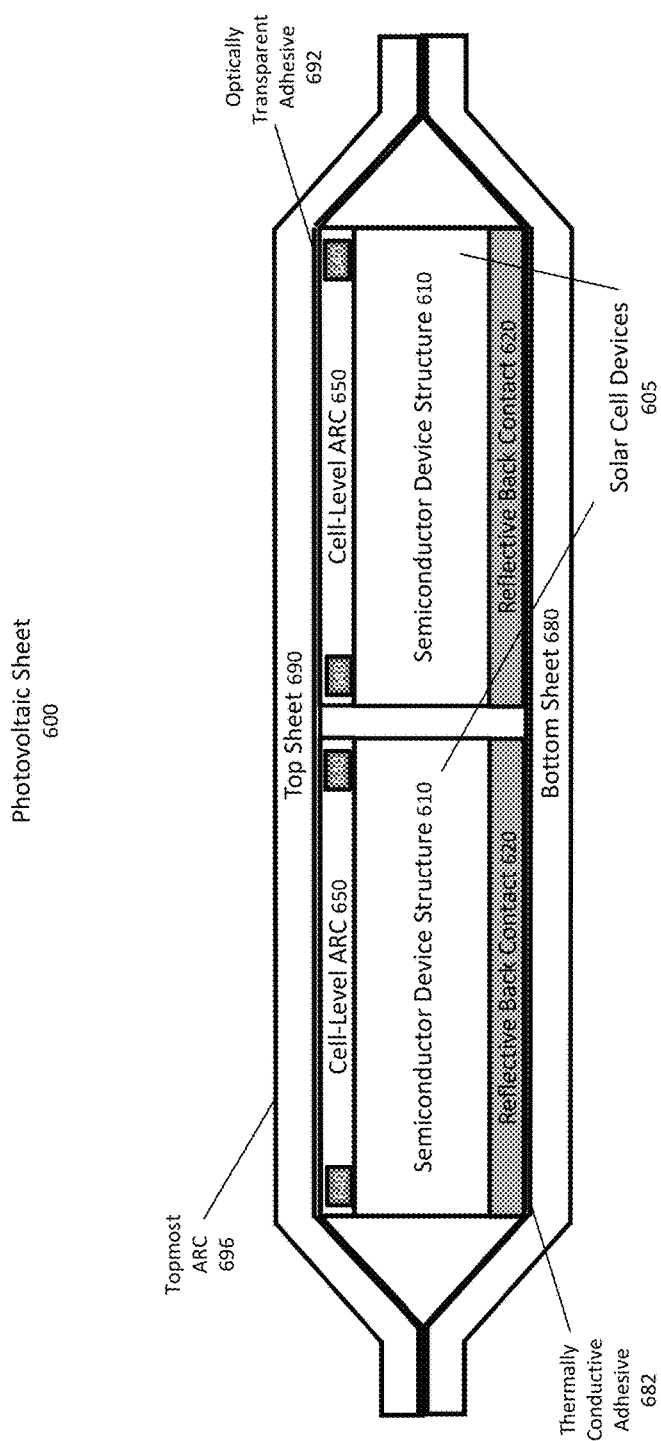
FIG. 6 is a schematic cross-sectional side view of a flexible photovoltaic sheet, according to an illustrative embodiment.

FIG. 6 illustrates a diagram of a cross-sectional view of a flexible photovoltaic sheet 600 according to an illustrative embodiment. Solar cell devices 605 are formed by adding a reflective back contact 620 on the underside of a semiconductor device structure 610 and applying top electrical contacts 640 and a cell-level antireflective coating 650. The "cell-level" antireflective coating refers to the portion of the antireflective coating that is positioned above the cell, but below the top sheet encapsulant. The cell-level ARC portion of the antireflection structure is generally applied to the cell prior to encapsulation via a coating process. In FIG. 6, the topmost ARC 696, top sheet 690, optically transparent adhesive 692, and cell-level ARC 650 all effectively function together as an antireflection structure, but are fabricated in separate steps. The individual solar cell devices 605 are attached to a protective flexible bottom sheet 680, for example by using a thermally conductive adhesive 682. A flexible top sheet 690 is applied, for example by using an optically transparent adhesive 692. In some embodiments, the top sheet 690 is coated with a topmost antireflective coating 696. In an illustrative embodiment, the topmost antireflective coating 696 has layers of nanostructured silicon dioxide ($SiO_2$). In an illustrative embodiment, the flexible top sheet 690 is coated with a topmost antireflective coating 696 prior to its adhesion to the photovoltaic sheet 600, for example by employing an oblique angle deposition process. Electrical leads (not shown) are employed to connect the cells within the photovoltaic sheet 600 to an external load, as readily apparent to those ordinarily skilled in the art.

The encapsulant and antireflective coating structure 110 depicted in FIG. 1 is composed of several components which work together to maximize the transmittance of incidence sunlight into the underlying semiconductor absorber. As depicted in FIG. 6, the components of the encapsulant and antireflective coating structure 110 can include a topmost antireflective coating 696, a protective transparent top sheet 690, an optically transparent adhesive 692, and a cell-level antireflective coating 650. In an illustrative embodiment, the topmost antireflective coating 696 comprises multiple layers of nanostructured $SiO_2$, as described, for example, in provisional patent application Ser. No. 61/683,676 entitled "Broadband, Omnidirectional Antireflection Structures and Method of Constructing the Same" and entitled "Broadband, Omnidirectional Antireflection Structures on Large Area Substrates and Methods of Constructing the Same." Nanostructured $SiO_2$ can also be employed in the cell-level antireflective coating 650 to improve performance.

Figure 7:
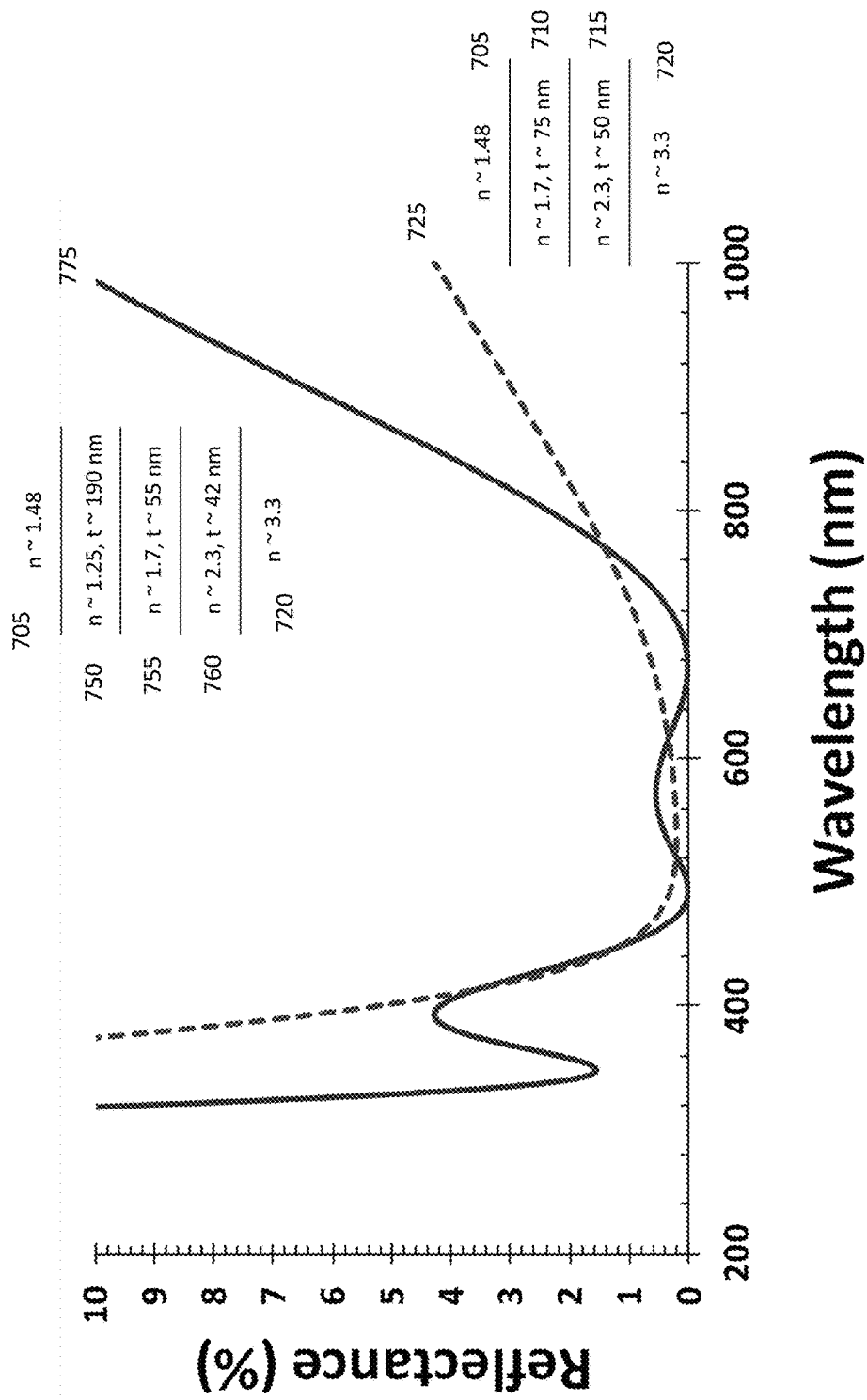
FIG. 7 is a graphical diagram showing the calculated normal incidence reflectance spectra of two different optical structures shown inset, according to an illustrative embodiment

FIG. 7 is a graphical diagram that compares the calculated reflectance of a conventional cell-level antireflective coating to an improved coating that includes the use of a lower refractive index material such as nanostructures $SiO_2$. In particular, curve 725 is the calculated normal incidence reflection of a conventional two-layered structured comprised of 50 nm of material 715 with a refractive index of 2.3 (e.g. $TiO_2$) and 75 nm of material 710 with a refractive index of 1.6 (e.g. $Al_2O_3$), sandwiched between infinitely thick layers of material 705 with a refractive index of 1.48 (dense $SiO_2$) and material 720 with a refractive index of 3.3 (III-V semiconductor). On the other hand, curve 775 is the calculated normal incidence reflection of a novel three-layered structured comprised of 42 nm of material 760 with a refractive index of 2.3 (e.g. $TiO_2$) and 55 nm of material 755 with a refractive index of 1.6 (e.g. $Al_2O_3$), and 190 nm of material 750 with a refractive index of 1.25 (e.g. nanostructured $SiO_2$), sandwiched between infinitely thick layers of material 705 with a refractive index of 1.48 (dense $SiO_2$) and material 720 with a refractive index of 3.3 (III-V semiconductor).

The reflectance curve 775 in FIG. 7 is characterized by low reflectance at visible to near infrared wavelengths (<1% between 400 and 850 nm), but increasing reflectance at longer wavelengths (>8% @ 950 nm). These reflectance characteristics enhance the performance of solar cell structures such as the one summarized in FIG. 3. In particular, photons with energies above the band edge of the GaAs are efficiently transmitted into the absorber layers. On the other hand, some of the photons emitted upward by the InGaAs well are reflected back into the absorber region for re-absorption. Without being bound to a particular theory, higher reflectance at longer wavelengths can also enhance optical cavity effects that can be engineered to enhance absorption within the narrow energy gap well region (for example 350 of the structure depicted in FIG. 3). More complex optical coating designs can be implemented that leverage optical interference, cavity, and waveguide phenomena to enhance optical absorption within the narrow band gap well 130 of the general structure depicted in FIG. 1. In particular, photonic crystal structures can be employed both below, above and surrounding the absorber region to trap incident and emitted light. A photonic crystal is constructed by layering materials with different optical properties, either in one, two, or three dimensions.

The foregoing has been a detailed description of illustrative embodiments of the invention. Various modifications and additions can be made without departing from the spirit and scope of this invention. Features of each of the various embodiments described above may be combined with features of other described embodiments as appropriate in order to provide a multiplicity of feature combinations in associated new embodiments. Furthermore, while the foregoing describes a number of separate embodiments of the apparatus and method of the present invention, what has been described herein is merely illustrative of the application of the principles of the present invention. For example, the illustrative embodiments can include additional layers to perform further functions or enhance existing, described functions. Likewise, while not shown, the electrical connectivity of the cell structure with other cells in an array and/or an external conduit is expressly contemplated and highly variable within ordinary skill. More generally, while some ranges of layer thickness and illustrative materials are described herein. It is expressly contemplated that additional layers, layers having differing thicknesses and/or material choices can be provided to achieve the functional advantages described herein. In addition, directional and locational terms such as "top", "bottom", "center", "front", "back", "above", and "below" should be taken as relative conventions only, and not as absolute. Furthermore, it is expressly contemplated that various semiconductor and thin films fabrication techniques can be employed to form the structures described herein. Accordingly, this description is meant to be taken only by way of example, and not to otherwise limit the scope of this invention.

What is claimed is:

1. A flexible photovoltaic sheet comprising:
    a top flexible sheet having an antireflective coating;
    a first solar cell device, comprising:
        a first antireflective structure adhered to the top flexible sheet via a first optically transparent adhesive;
        a first doped wide band-gap AlInP window;
        a first InGaP emitter;
        a first wide band gap AlGaAs barrier;
        a first AlGaAs extended emitter such that the first wide band gap AlGaAs barrier is disposed between the first InGaP emitter and the first AlGaAs extended emitter;
        a first GaAs depleted base, wherein a narrow band gap material is embedded within the first GaAs depleted base such that the narrow band gap material includes at least one asymmetric step-graded well, the at least one asymmetric step-graded well being asymmetric with respect to at least one number of steps or compositional amount;

a first underlying base structure having an opposite doping polarity as compared to the first doped wide band-gap AlInP window;
a first back surface field;
a first back contact layer; and
a first reflective back contact structure;
a second solar cell device, comprising:
a second antireflective structure adhered to the top flexible sheet via a second optically transparent adhesive;
a second doped wide band-gap AlInP window;
a second InGaP emitter;
a second wide band gap AlGaAs barrier;
a second AlGaAs extended emitter such that the second wide band gap AlGaAs barrier is disposed between the second InGaP emitter and the second AlGaAs extended emitter;
a second GaAs depleted base;
a second underlying base structure having an opposite doping polarity as compared to the second doped wide band-gap AlInP window;
a second back surface field;
a second back contact layer; and
a second reflective back contact structure; and
an underlying flexible sheet adhered to the first reflective back structure and the second reflective back structure such that the underlying flexible sheet extends beyond peripheral edges of the first solar cell device and the second solar cell device, wherein underlying flexible sheet and the top flexible sheet comprise two points of contact beyond the peripheral edges of the first solar cell device and the second solar cell device and encapsulate the first solar cell device and the second solar cell device.

2. The flexible photovoltaic sheet of claim 1 wherein an up-conversion device is inserted above the first reflective back contact structure.

3. The flexible photovoltaic sheet of claim 1 wherein the first reflective back contact structure comprises a metal film perforated with $SiO_2$ material.

4. The flexible photovoltaic sheet of claim 1 wherein the antireflective coating comprises at least one layer of $SiO_2$ nanostructured materials.

5. The flexible photovoltaic sheet of claim 1 wherein the top sheet and first antireflective structure includes $SiO_2$-based material below the top sheet.

6. The flexible photovoltaic sheet of claim 1 wherein the at least one asymmetric step-graded well has embedded quantum dots.

7. The flexible photovoltaic sheet of claim 1 wherein back surface field and back contact layers contain InGaP and AlGaAs materials.

8. A flexible photovoltaic sheet comprising:
a top flexible sheet;
an antireflective structure disposed immediately adjacent to the top flexible sheet such that the top flexible sheet extends beyond a peripheral edge of the antireflective structure;
a doped wide band-gap AlInP window;
an InGaP emitter;
a wide band gap AlGaAs barrier;
an AlGaAs extended emitter;
a GaAs depleted base, wherein a narrow band gap material is embedded within the GaAs depleted base such that the narrow band gap material includes at least one asymmetric step-graded well, the at least one asymmetric step-graded well being asymmetric with respect to at least one number of steps or compositional amount;
an underlying base structure having an opposite doping polarity as compared to the doped wide band-gap AlInP window;
a back surface field;
a back contact layer; and
a reflective back contact structure; and
an underlying flexible sheet disposed immediately adjacent to the reflective back structure such that the underlying flexible sheet extends beyond a peripheral edge of the reflective back contact structure, wherein underlying flexible sheet and the top flexible sheet comprise two points of contact and encapsulate the antireflective structure and the a reflective back contact structure.

9. The flexible photovoltaic sheet of claim 8 wherein an up-conversion device is inserted above the reflective back contact structure.

10. The flexible photovoltaic sheet of claim 8 wherein the reflective back contact structure comprises a metal film perforated with $SiO_2$ material.

11. The flexible photovoltaic sheet of claim 8 wherein the top sheet and antireflective structure employs $SiO_2$ nanostructured materials on a topmost surface.

12. The flexible photovoltaic sheet of claim 8 wherein the top sheet and antireflective structure includes $SiO_2$-based material below the top sheet.

13. The flexible photovoltaic sheet of claim 8 wherein the at least one asymmetric step-graded well has embedded quantum dots.

14. The flexible photovoltaic sheet of claim 8 wherein the back surface field and back contact layers contain InGaP and AlGaAs materials.

15. The flexible photovoltaic sheet of claim 8 wherein the top sheet and antireflective structure includes a multi-layer film of nanostructured $SiO_2$ material that coats the topmost surface of the top sheet.

16. The flexible photovoltaic sheet of claim 8 wherein the top encapsulant and antireflective structure includes a multi-layered antireflective coating on a cell below the top sheet containing at least one layer of nanostructure $SiO_2$ material.

17. A flexible photovoltaic sheet comprising:
a top flexible sheet;
an antireflective structure disposed immediately adjacent to the top flexible sheet such that the top flexible sheet extends beyond a peripheral edge of the antireflective structure;
a doped wide band-gap AlInP window;
an InGaP emitter;
a wide band gap AlGaAs barrier;
an AlGaAs extended emitter;
a GaAs depleted base, wherein a narrow band gap material is embedded within the GaAs depleted base such that the narrow band gap material includes at least one asymmetric step-graded well, the at least one asymmetric step-graded well being asymmetric with respect to number of steps and compositional amount;
an underlying base structure having an opposite doping polarity as compared to the doped wide band-gap AlInP window;
a back surface field;
a back contact layer; and
a reflective back contact structure; and
an underlying flexible sheet disposed immediately adjacent to the reflective back structure such that the underlying flexible sheet extends beyond a peripheral edge of the reflective back contact structure, wherein underlying flexible sheet and the top flexible sheet comprise two points of contact and encapsulate the antireflective structure and the a reflective back contact structure.

* * * * *